United States Patent
Kwon et al.

(10) Patent No.: US 7,180,358 B2
(45) Date of Patent: Feb. 20, 2007

(54) CMOS EXPONENTIAL FUNCTION GENERATING CIRCUIT WITH TEMPERATURE COMPENSATION TECHNIQUE

(75) Inventors: Jong Kee Kwon, Daejeon (KR); Mun Yang Park, Daejeon (KR); Jong Dae Kim, Daejeon (KR); Won Chul Song, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 73 days.

(21) Appl. No.: 11/004,432

(22) Filed: Dec. 3, 2004

(65) Prior Publication Data

US 2005/0140423 A1 Jun. 30, 2005

(30) Foreign Application Priority Data

Dec. 26, 2003 (KR) ............... 10-2003-0097244

(51) Int. Cl.
*G06G 7/20* (2006.01)
(52) U.S. Cl. ............... 327/346; 327/347; 327/348; 327/512; 327/513
(58) Field of Classification Search ............... None
See application file for complete search history.

(56) References Cited

U.S. PATENT DOCUMENTS

| | | | | |
|---|---|---|---|---|
| 5,200,655 A | * | 4/1993 | Feldt | 327/346 |
| 5,534,813 A | * | 7/1996 | DeMicheli | 327/346 |
| 5,757,230 A | | 5/1998 | Mangelsdorf | 330/133 |
| 5,940,235 A | * | 8/1999 | Sasaki et al. | 360/67 |
| 5,952,867 A | * | 9/1999 | Choi | 327/346 |
| 6,369,618 B1 | * | 4/2002 | Bloodworth et al. | 327/103 |
| 6,879,204 B1 | * | 4/2005 | Kanou | 327/346 |
| 6,882,185 B1 | * | 4/2005 | Walker et al. | 327/103 |
| 6,930,532 B2 | * | 8/2005 | Kanou et al. | 327/346 |

FOREIGN PATENT DOCUMENTS

JP 2003-198291 7/2003

OTHER PUBLICATIONS

Siang Tong Tan et al., "A 270 MHz, 1 $V_{pk-pk}$, Low-Distortion Variable Gain Amplifier in 0.35 μm CMOS Process," ESSCIRC 2002 (pp. 307-310).
W.C. Song et al., "High frequency/high dynamic range CMOS VGA," Electronics Letters Jun. 22, 200, vol. 36, No. 13 (pp. 1096-1098).

* cited by examiner

*Primary Examiner*—Tuan T. Lam
*Assistant Examiner*—Hiep Nguyen
(74) *Attorney, Agent, or Firm*—Blakely Sokoloff Taylor & Zafman

(57) ABSTRACT

Provided is a CMOS exponential function generating circuit capable of compensating for the exponential function characteristic according to temperature variations. The exponential function generating circuit includes an voltage scaler scaling the value of an external gain control voltage signal, an exponential function generating unit generating exponential function current and voltage in response to a signal output from the voltage scaler, a reference voltage generator providing a reference voltage to the exponential function generating unit, and a temperature compensator compensating for the exponential function characteristic according to temperature variations.

11 Claims, 3 Drawing Sheets

CMOS EXPONENTIAL FUNCTION GENERATING CIRCUIT WITH TEMPERATURE COMPENSATION TECHNIQUE

BACKGROUND OF THE INVENTION

This application claims the priority of Korean Patent Application No. 2003-97244, filed on Dec. 26, 2003, in the Korean Intellectual Property Office, the disclosure of which is incorporated herein in its entirety by reference.

1. Field of the Invention

The present invention relates to a voltage reference generating circuit, and more particularly, to a CMOS exponential function generating circuit with a temperature compensation technique 2. Description of the Related Art In general, a variable gain amplifier (VGA), which is a block circuit in the component of an automatic gain controlled (AGC) circuit, provides a variable gain that is linearly proportional to the applied control voltage on a decibel (dB) scale.

When designing a variable gain amplifier, the most important thing that has to be considered is the possibility of accurately controlling a gain according to an applied control voltage. Such gain control is enabled by an accurate exponential function as the relationships between current and voltage of a bipolar transistor embedded within the variable gain amplifier.

In addition, a conventional variable gain amplifier is composed of CMOS circuits which allow this amplifier to be easily and conveniently integrated with other circuits, and the gain is adjusted by an exponential the characteristics of a parasitic bipolar transistor in the CMOS process technology.

However, in the CMOS variable gain amplifier, the value of a threshold voltage of a metal oxide semiconductor (MOS) device is changed due to a process deviations, temperature variations, and noises of a power supply voltage. Therefore, since the values of both an input signal and an output signal of the CMOS variable gain amplifiers are limited, it is difficult to smoothly operate the CMOS variable gain amplifier. In other words, since the operation of the CMOS variable gain amplifier depends highly on process variables, temperature, and a power supply voltage, it is very difficult for the variable gain amplifier with an accurate exponential function to be integrated.

SUMMARY OF THE INVENTION

According to an aspect of the present invention, there is provided a CMOS exponential function generating circuit with a temperature compensation technique, which includes a voltage scaler which adjusts the level of an scaled voltage signal for proper operation of bipolar transistor, an exponential function generator which generates exponential function current according to an output signal from the voltage adjuster, a reference voltage generator which applies a reference voltage to the exponential function generator, and a temperature compensator which compensates for the exponential function according to a temperature variations.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The above and other features and advantages of the present invention will become more apparent by describing in detail exemplary embodiments thereof with reference to the attached drawings. While the present invention has been particularly shown and described with reference to exemplary embodiments thereof, it will be understood by those of ordinary skill in the art that various changes in form and details may be made therein without departing from the spirit and scope of the present invention.

Figure 1:
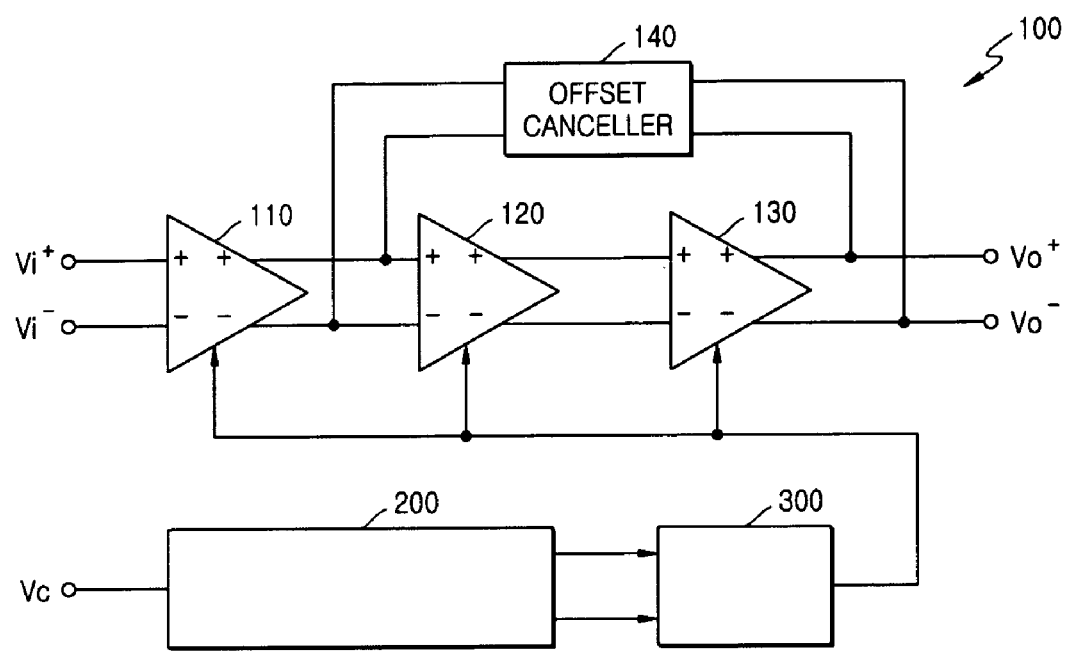
FIG. 1 is a schematic diagram of a variable gain amplifier with a CMOS exponential function generating circuit as an embodiment of the present invention with a temperature compensation technique.

FIG. 1 is a schematic diagram of a voltage generating unit 100 with a CMOS exponential function generating circuit 200 with a temperature compensation technique according to an embodiment of the present invention, installed into a CMOS variable gain amplifier. The voltage generating unit 100 includes first through third variable gain amplifiers 110,120, and 130, an offset canceller 140, the CMOS exponential function generating circuit 200 which compensates for a deviations due to temperature variations, and an internal gain control signal generating circuit for variable gain control 300.

The first through third variable gain amplifiers 110,120, and 130 are consecutively connected so that an output signal of the first variable gain amplifier 110 becomes an input signal of the second variable gain amplifier 120, and an output signal of the second variable gain amplifier 120 becomes an input signal of the third variable gain amplifier 130. Signals Vi+ and Vi−, which have different phases, are input to an input terminal of the first variable gain amplifier 110.

The offset canceller 140 is connected between an output terminal of the first variable gain amplifier 110 and an output terminal of the third variable gain amplifier 130 so as to eliminate offset signals.

The CMOS exponential function generating circuit 200 receives an external gain control voltage signal $V_c$, generates exponential function according to the external gain control voltage signal Vc and converts it into linear gain control voltage on a decibel scale, and outputs the linear gain control voltage to the internal gain control signal generating circuit 300. The internal gain control signal generating circuit 300 receives the linear gain control voltage, makes an internal gain control signal, and transmits the internal gain control signal to the first through third variable gain amplifiers 110, 120, and 130. As previously mentioned, the CMOS exponential function generating circuit 200 includes a bipolar transistor and a CMOS transistor, which are formed by a CMOS process technologies, so that the CMOS exponential function generating circuit 200 can be easily integrated with other elements. Also, a parasitic bipolar transistor naturally generated during manufacture of a CMOS transistor is used as the bipolar transistor so as to minimize the deviations in an exponential function due to the temperature variations.

Figure 2:
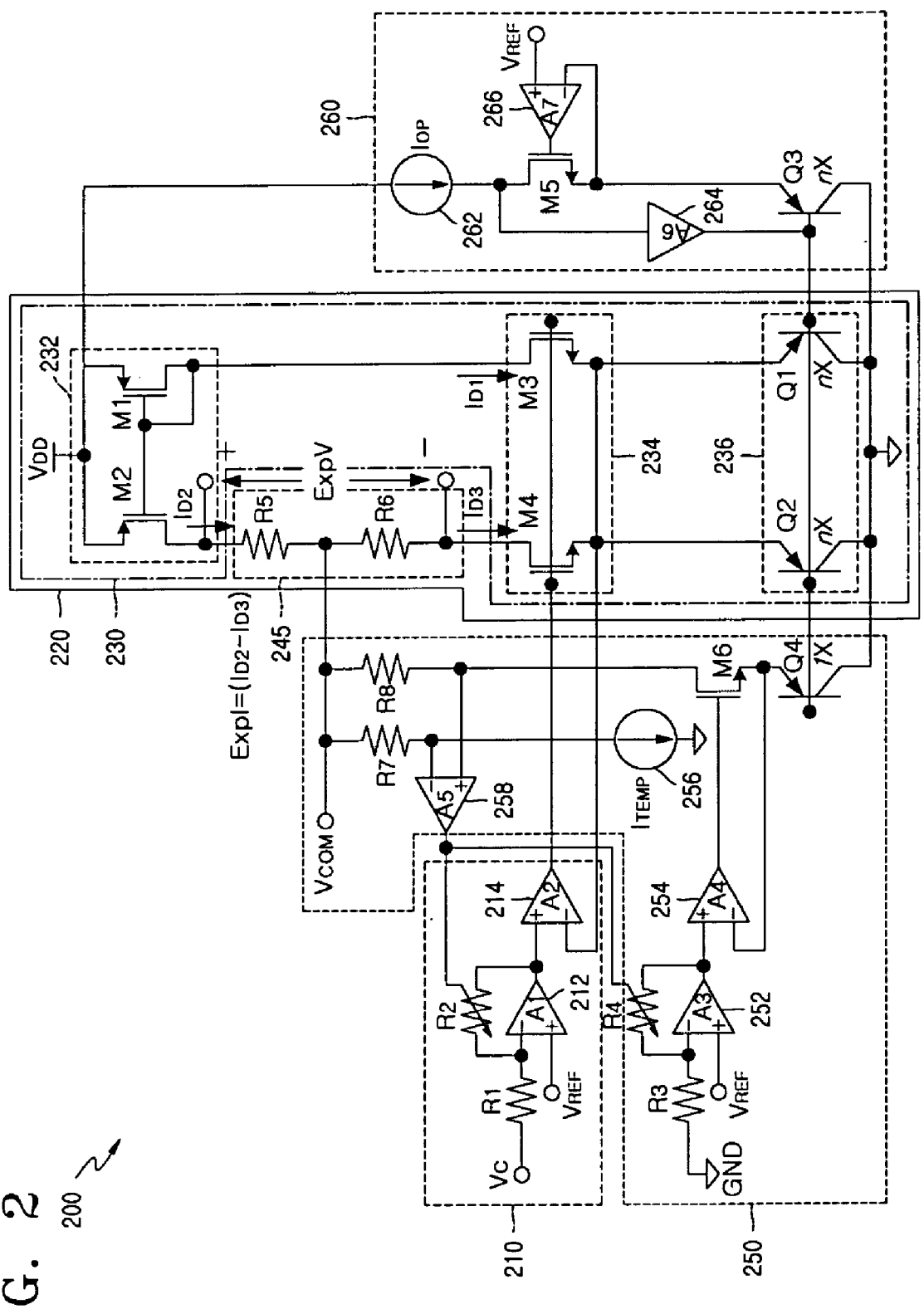
FIG. 2 is a circuit diagram of a CMOS temperature compensated exponential function generating circuit according to an embodiment of the present invention.

Referring to FIG. 2, the CMOS exponential function generating circuit 200 includes a voltage scaler 210, an exponential function generating unit 220, a temperature compensator 250, and a reference voltage generator 260.

The voltage scaler 210 includes a first operation amplifier 212 to which a first resistor R1 and a second resistor R2 are connected, and a second operation amplifier 214. The external gain control voltage signal $V_c$ and a reference voltage $V_{REF}$ are input to (−) and (+) input terminals of the external first operation amplifier 212, respectively, so that an inverse voltage can be output from the operation amplifier 212. Also, the first resistor R1 is connected to the (−) input terminal of the first operation amplifier 212, and the second resistor R2 which is a variable resistor for gain adjustment of first operation amplifier 212, is connected between the (−) input terminal and output terminal thereof. A signal output from the first operation amplifier 212 is input to a (+) input terminal of the second operation amplifier 214. The second operation amplifier 214 buffers the signal output from the first operation amplifier 212.

The exponential function generating unit 220 includes an exponential function current generator 230 and an exponential function voltage generator 245.

The exponential function current generator 230 includes a current source 232, a scaled voltage signal transfer unit 234, and a bipolar transistor unit 236. The current source 232 is constructed in which first and second MOS transistors M1 and M2, which are PMOS transistors, are connected to form a current mirror. In other words, the gates of the first and second MOS transistors M1 and M2 are connected, and the gate and drain of the first MOS transistor M1 are connected.

The scaled voltage signal transfer unit 234 includes a third transistor M3 and a fourth transistor M4 whose sources are connected. The third and fourth transistors M3 and M4 are NMOS transistors. A voltage output from the second operation amplifier 214 is applied to gates of the third and fourth MOS transistors M3 and M4. The drain of the third MOS transistor M3 is connected to that of the first MOS transistor M1, and the drain of the fourth MOS transistor M4 is electrically connected to the second MOS transistor M2. The sources of the third and fourth MOS transistors M3 and M4 are connected to the (−) input terminal of the second operation amplifier 214 of the voltage scaler 210 so as to provide a (−) input signal generated by the second operation amplifier 214.

The bipolar transistor unit 236 includes a first bipolar transistor Q1 and a second bipolar transistor Q2 whose bases and collectors are connected, respectively. As described above, the first and second bipolar transistors Q1 and Q2 may be parasitic bipolar transistors. That is, the sizes of emitters of the first and second bipolar transistors Q1 and Q2 may be n times (n×) more than the sizes of the fourth MOS transistor M4, and the first and second bipolar transistors Q1 and Q2 generate exponential function current EXPI in response to a voltage output from the second operation amplifier 214 of the voltage scaler 210. Further, the collectors of the first and second bipolar transistors Q1 and Q2 are common-connected and grounded, the emitter of the first bipolar transistor Q1 is connected to the source of the third MOS transistor M3, and the emitter of the second bipolar transistor Q2 is connected to the source of the fourth MOS transistor M4.

The exponential function voltage generator 245 includes a fifth resistor R5 and a sixth resistor R6 that are connected in series. One end of the fifth resistor R5 is connected to the drain of the second MOS transistor M2 and one end of the sixth resistor R6 is connected to the drain of the fourth MOS transistor M4. An exponential function voltage ExpV output from the exponential function voltage generator 245 is a differential voltage between the fifth and sixth resistors R5 and R6. The exponential function current ExpI is the difference $I_{D2}$–$I_{D3}$ between a drain current $I_{D2}$ of the second MOS transistor M2 and a drain current $I_{D3}$ at the drain of the fourth MOS transistor M4.

A temperature compensator 250 includes a third operation amplifier 252 connected to third and fourth resistors R3 and R4, a fourth operation amplifier 254, a first external current source $I_{temp}$ 256, a fifth operation amplifier 258 connected to sixth and seventh resistors R6 and R7, a sixth MOS transistor M6, and a fourth bipolar transistor Q4.

The (−) input terminal of the third operation amplifier 252 is grounded or a power supply voltage is applied thereto, and a reference voltage $V_{REF}$ is applied to the (+) input of the third operation amplifier 252. In addition, the third resistor R3 is connected to the (−) input terminal of the third operation amplifier 252, and the fourth resistor R4, which is a variable resistor for gain adjustment of first operation amplifier 252, is connected between the (−) input terminal and output terminal of the third operation amplifier 252.

When a signal output from the third operation amplifier 252 is applied to the (+) input terminal of the fourth operation amplifier 254, the fourth operation amplifier 254 buffers this signal. A signal output from the fourth operation amplifier 254 is input to the gate of the sixth MOS transistor M6 that is an NMOS transistor. The drain of the sixth MOS transistor M6 is connected to the (−) input terminal of the fourth operation amplifier 254.

The emitter of the fourth bipolar transistor Q4 is connected to the drain of the sixth MOS transistor M6 and its collector is connected to both the collectors of the first and second bipolar transistors Q1 and Q2. The size of the fourth bipolar transistor Q4 is preferably 1/n times (1×) less than the sizes of the first and second bipolar transistors Q1 and Q2. The fourth bipolar transistor Q4 may also be a parasitic bipolar transistor and change a collector current due to a temperature variations.

The (−) input terminal of the fifth operation amplifier 258 is connected to the first external current source 256 and the seventh resistor R7, and its (+) input terminal is connected to the eighth resistor R8 connected to the source of the sixth MOS transistor M6. An end of the seventh resistor R7 is connected to an end of the eighth resistor R8, and they are also common-connected to a node connected to both the fifth and sixth resistors R5 and R6. A common voltage $V_{COM}$ is applied to the seventh and eighth resistors R7 and R8. The first external adjustable current source 256 is a temperature compensated current source that supplies a predetermined bias to the fifth operation amplifier 258 according to temperature deviations when the fourth bipolar transistor Q4 detects a change in a current at its collector when the collector current of the fourth bipolar transistor Q4 due to a temperature variations.

When there are some temperature variations, the collector current of the fourth bipolar transistor Q4 changes. Accordingly, there may be some changes of the voltage levels at the both ends of the seventh and of the eighth transistors, R7 and R8, thereby changing both the exponential function voltage and current. Thus, above voltage levels at the both ends of resistors R7 and R8 changed by the temperature variations, are applied to the fifth operation amplifier 258. The output voltage is applied to the second and fourth resistors R2 and R4, which generate variable resistances, thereby controlling the resistance values therefrom. In other words, the resistance values of the second and fourth resistors R2 and R4, which control the magnitudes of the exponential function voltage and current, are changed according to a signal output from the fifth operation amplifier 258 to which the predetermined bias is applied to according to temperature.

The reference voltage generator 260 includes a second external current source 262, a third bipolar transistor Q3, a sixth operation amplifier 264, a seventh operation amplifier 266, and a fifth MOS transistor M5.

A reference voltage $V_{REF}$ is applied to the (+) input terminal of the seventh operation amplifier 266 and a signal output from the seventh operation amplifier 266 is input to the gate of the fifth MOS transistor M5 that is an NMOS transistor. The drain of the fifth MOS transistor M5 is connected to the second external current source 262 to which the power supply voltage $V_{DD}$ is applied, and its source is connected to the emitter of the third bipolar transistor Q3. The collector and base of the third bipolar transistor Q3 is connected to all the collectors and bases of the first, second, and fourth bipolar transistors Q1, Q2, and Q4. Also, the sixth operation amplifier 264 is connected between the drain of the fifth MOS transistor M5 and the base of the third bipolar transistor Q3. Accordingly, a bias amplified by the sixth operation amplifier 264 is applied to the bases of the first through fourth bipolar transistors Q1 through Q4. The (−) input terminal of the seventh operation amplifier 266 is connected to the drain of the fifth MOS transistor M5.

The operation of an exponential function generating circuit with the above construction according to the present invention will now be described. First, input of the external gain control voltage signal $V_C$ to the first operation amplifier 212 generates an inverse voltage scaled by the first and second resistors R1 and R2. A voltage (signal) output from the first operation amplifier 212 is input to the gates of the third and fourth MOS transistors M3 and M4 of the exponential function current generator 230 via the second operation amplifier 214. In this case, the voltage output from the first operation amplifier 212 is applied to the sources of the third and fourth MOS transistors M3 and M4, and the source voltages of the third and fourth MOS transistors M3 and M4 are applied to the second operation amplifier 214.

As described above, the signal output from the first operation amplifier 212 is input to the sources of the third and fourth MOS transistors M3 and M4, and as a result, this signal is transmitted to the emitters of the first and second bipolar transistors Q1 and Q2. A uniform amount of a bias current $I_{op}$ supplied from the second external current source 262 flows through the emitter of the third bipolar transistor Q3 connected to the first and second bipolar transistors Q1 and Q2. A base voltage $V_b$ of the third bipolar transistor Q3 is set by the second external current source 262, the sixth operation amplifier 264, and the seventh operation amplifier 266. The base voltage $V_b$ of the third bipolar transistor Q3 becomes a base voltage at the first, second, and fourth bipolar transistors Q1, Q2, and Q4.

The generation of the base voltage $V_b$ of the first and second bipolar transistors Q1 and Q2 minimizes a change in an output current caused by changes in base-emitter voltage $V_{be}$ of the bipolar transistors Q1, Q2, and Q3, temperature, and processes when the reference voltage $V_{REF}$ is a rough half in the range of a gain control voltages, i.e., from 0 to $V_c$.

If the external gain control voltage signal $V_c$ varies, the collector current of the first and second bipolar transistors having a shape of an exponential function flows at the drain of the third and fourth MOS transistors by the current source 232 composed of the first and second MOS transistors. The current $I_o$ can be expressed as follows:

$$Io = K1 \cdot \text{EXP}(-K2 \cdot Vc - V_{com}) \quad (1),$$

wherein K1 denotes a function of the sizes of the first and second bipolar transistors Q1 and Q2, K2 denotes a scaling constant related to the third and second resistors R1 and R2, $V_{COM}$ denotes an external voltage, and the external voltage $V_{COM}$ becomes a common mode voltage(DC) level of the exponential function voltage ExpV.

As described above, the base voltage $V_b$ at the first through fourth bipolar transistors Q1~Q4 is changed by the current $I_{op}$ from the second external current source 262. Thus, it is possible to obtain a current with a desired magnitude and exponential function characteristics by adjusting the function K1, the scaling constant K2, and the current $I_{op}$, and a differential exponential function voltage using the fifth and sixth resistors R5 and R6 of the exponential function voltage generator 245.

When the external gain control voltage signal $V_c$ is equivalent to the reference voltage $V_{REF}$, a temperature change is compensated for by the second external current source 262, the sixth operation amplifier 264, and the third bipolar transistor Q3. That is, the CMOS exponential function generating circuit 200 according to the present invention has a circuit construction in which the exponential function characteristics change sensitively according to a temperature parameter determined by the external gain control voltage signal $V_c$.

To be more specific, the exponential function voltage characteristics change remarkably when a temperature variation causes the external gain control voltage signal $V_c$ to have a minimum value ($V_c = V_{cmin}$), i.e., 0V, or a maximum value ($V_c = V_{cmax}$), i.e., $V_{DD}$. However, the exponential function voltage characteristics hardly change when the voltage of the external gain control voltage signal $V_c$ approximates the reference voltage $V_{REF}$. That is, an exponential function voltage increases or decreases like a seesaw according to the temperature with respect to the reference voltage $V_{REF}$ within the range of gain control. This is because the inclination (gradient) of the exponential function voltage, which is expressed by units of decibel, changes linearly according to thermal voltages at the first and second bipolar transistors Q1 and Q2 and resistances output from the first and second resistors R1 and R2.

The inclination of the exponential function voltage can be expressed as follows:

$$\text{gradient} \propto \frac{R2}{R1} \cdot \frac{1}{Vt}, \; Vt = kT/q \quad (2)$$

Accordingly, to compensate for the inclination of the exponential function voltage, a voltage gain changing according to the temperature can be adjusted by adjusting the ratios, i.e., R2/R2 and R4/R3, of resistances at the first and third operation amplifiers 212 and 252, and applying a ground voltage or a power supply voltage to an input terminal of the third operation amplifier 252.

The temperature compensator 250 allows the ratios of resistances to be automatically adjusted. That is, it is possible to control an exponential function voltage changing according to the temperature variations using the third operation amplifier 254 and the sixth MOS transistor M6 of the temperature compensator 250, the amount of change $\Delta Ic(T)$ in a current at the collector of the fourth bipolar transistor Q4 according to the temperature variations, and the characteristics of the fifth operation amplifier 258 determined by the first external current source 256 and the seventh and eighth resistors R7 and R8.

In other words, a voltage output from the fifth operation amplifier 258 is connected to the second and fourth resistors R2 and R4 such that the voltage is fed back to the second and fourth resistors R2 and R4. Therefore, it is possible to control the ratios of resistances, i.e., R2/R1 and R4/R3, according to the temperature variations, thereby stably generating the exponential function voltage. The second and fourth resistors may be realized using on-resistance characteristics of the MOS transistors operating in a linear region.

The inclination of the exponential function voltage, which is expressed with units of decibel, can be expressed as follows:

$$20 \log (\text{Exp}V_{max}/\text{Exp}V_{min}) \times (V_{REF}/Vc_{max}) = 20 \log (n \times I_{temp})/I_{op} \quad (3)$$

That is, as expressed in Equation (3), the inclination of the exponential function voltage can be adjusted using the first and second external current sources 256 and 266, thereby compensating for exponential function voltage and current changing according to the temperature variations.

Figure 3:
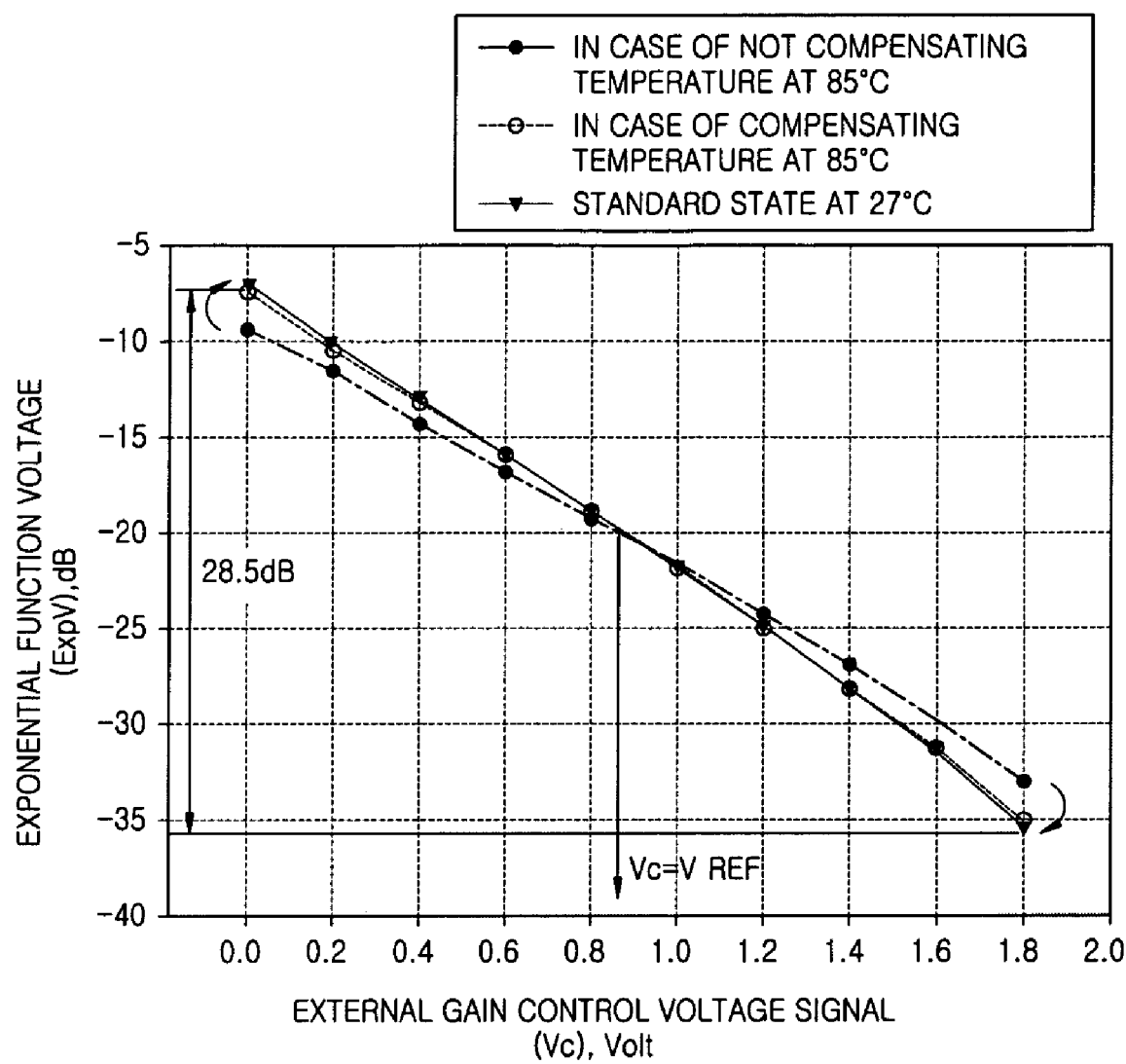
FIG. 3 is a graph illustrating a variation in a voltage of an exponential function generating circuit according to an embodiment of the present invention, output in response to an adjusted voltage signal.

FIG. 3 is a graph illustrating a variation in an exponential function voltage output from an exponential function generating circuit according to the present invention, the exponential function voltage changing according to the voltage of an external gain control voltage signal $V_C$. The graph of FIG. 3 reveals that the inclination of the exponential function voltage changing according to the temperature is automatically increased or reduced like a seesaw owing to a temperature compensator on a basis of when the voltage of the external gain control voltage signal $V_C$ is equivalent to a reference voltage $V_{REF}$, thereby compensating for a voltage gain according to the temperature.

As described above, a CMOS exponential function generating circuit according to the present invention includes a temperature compensator having bipolar transistors that are parasitically generated during manufacture of a CMOS transistor, and a reference voltage generator. The temperature compensator detects a change in a current at a collector of a bipolar transistor and compensates for a change in the inclination of an exponential function voltage generated.

In addition, the present invention allows a voltage gain to be stably adjusted and supplied to a variable gain amplifier, thereby obtaining low-distortion and high-bandwidth characteristics.

What is claimed is:

1. An exponential function generator circuit with a temperature compensation technique, comprising:
    a voltage scaler including a first operation amplifier and a second operation amplifier, the voltage scaler scaling the value of an external gain control voltage signal;
    an exponential function generating unit generating exponential function current and voltage in response to a signal output from the voltage scaler;
    a reference voltage generator providing a reference voltage to the exponential function generating unit; and
    a temperature compensator compensating for a change in an output of the voltage scaler according to temperature variations in voltage scaler, wherein the exponential function generating unit comprises an exponential function current generator generating an exponential function current and an exponential function voltage generator generating an exponential function voltage, in response to a signal output from the second operation amplifier.

2. The circuit of claim 1, wherein the voltage scaler comprises:
    the first operation amplifier having a (−) input terminal to which the external gain control voltage signal is input and a (+) input terminal to which the reference voltage is applied;
    a first resistor connected to the (−) input terminal of the first operation amplifier; and
    a second resistor connected between the (−) input terminal and an output terminal of the first operation amplifier.

3. The circuit of claim 2, wherein the second operation amplifier buffering a signal output from the output terminal of the first operation amplifier.

4. The circuit of claim 1, wherein the exponential function current generator comprises: a signal transfer unit including a pair of MOS transistors which have gates to to receive the signal output from the second operation amplifier;
    a first bipolar transistor and a second bipolar transistor connected to drains of the MOS transistors, respectively, and to which the signal output from the second operation amplifier is input; and
    a current mirror type current source proving a predetermined bias current to the signal transfer unit.

5. The circuit of claim 4, wherein the exponential function voltage generator comprises a pair of resistors connected in series between the current mirror current source and one of sources of the pair of MOS transistors of the signal transfer unit.

6. The circuit of claim 2, wherein the temperature compensator comprises:
    fourth bipolar transistor used for detecting a change in a collector current signal output from its collector according to the temperature variations in the voltage scaler;
    an external current source providing a predetermined bias current based on change in the collector current signal output from the collector of the fourth bipolar transistor;
    a third operation amplifier coupled to a fourth operation amplifier, the fourth operation amplifier coupled to the fourth bipolar transistor:
    a third resistor connected to the (−) input terminal of the third operation amplifier; and
    a fourth resistor having variable resistance is connected between the (−) input terminal and an output terminal of the third operation amplifier;
    a fifth operation amplifier outputting a control signal for controlling the signal output from the [external gain] voltage scaler according to the change in the collector current signal output from the collector of the fourth bipolar transistor and the bias current given from the external current source.

7. The circuit of claim 6, wherein the temperature compensator further comprises:
    a MOS transistor transmitting a signal output from the fourth operation amplifier to the fourth bipolar transistor,
    wherein a seventh resistor is connected to a (−) input terminal of a fifth operation amplifier, and
    an eighth resistor is connected to the (+) input terminal of the fifth operation amplifier, and
    a signal output from the fifth operation amplifier changes resistances of the second and fourth resistors to control voltage gains of the first and third operation amplifiers, wherein the third operation amplifier to which one of a ground voltage and a power supply voltage, and the reference voltage are input.

8. The circuit of claim 6, wherein the reference voltage generator comprises:
   a sixth operation amplifier coupled to a third bipolar transistor, and
   a seventh operation amplifier to which the reference voltage is applied;
   a fifth MOS transistor to which a signal output from the sixth operation amplifier is applied, an emitter of the third bipolar transistor is connected to the source of the fifth MOS transistor; and
   wherein a drain of the fifth MOS transistor is connected to an external current source connected to a power supply voltage, and
   the sixth operation amplifier is connected between the drain of the fifth MOS transistor and a base of the third bipolar transistor to generate a base voltage of the third bipolar transistor.

9. The circuit of claim 8, wherein collectors of the first through fourth bipolar transistors are coupled and further coupled to a grounding terminal, and the signal output from the sixth operation amplifier is input to bases of the first through fourth bipolar transistors.

10. An exponential function generator circuit with a temperature compensation technique, comprising:
    a voltage scaler scaling the value of an external gain control voltage signal;
    an exponential function generating unit generating exponential function current and voltage in response to a signal output from the voltage scaler;
    a reference voltage generator providing a reference voltage to the exponential function generating unit; and
    a temperature compensator compensating for a change in an output of the voltage scaler according to temperature variations in voltage scaler,
    wherein the voltage scaler comprises:
    a first operation amplifier having a (−) input terminal to which the external gain control voltage signal is input and a (+) input terminal to which the reference voltage is applied;
    a first resistor connected to the (−) input terminal of the first operation amplifier; and a second resistor connected between the (−) input terminal and an output terminal of the first operation amplifier.

11. An exponential function generator circuit with a temperature compensation technique, comprising:
    a voltage scaler scaling the value of an external gain control voltage signal, the voltage scaler including a first operation amplifier and a second operation amplifier buffering a signal output from an output terminal of the first operation amplifier;
    an exponential function generating unit generating exponential function current and voltage in response to a signal output from the voltage scaler;
    a reference voltage generator providing a reference voltage to the exponential function generating unit; and
    a temperature compensator compensating for a change in an output of the voltage scaler according to temperature variations in the voltage scaler, wherein the temperature compensator to control voltage gain in the first operation amplifier with an output signal from a third operation amplifier.

* * * * *